United States Patent
Hase et al.

(10) Patent No.: US 6,171,975 B1
(45) Date of Patent: *Jan. 9, 2001

(54) WET-CHEMICAL TREATMENT METHOD, TREATMENT METHOD OF SEMICONDUCTOR SUBSTRATE, AND MANUFACTURING METHOD OF SEMICONDUCTOR DEVICE

(75) Inventors: Ushio Hase; Kenichi Yamamoto; Ichiro Miyazawa, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/048,282

(22) Filed: Mar. 26, 1998

(30) Foreign Application Priority Data

Jul. 29, 1997 (JP) .................................................. 9-203405

(51) Int. Cl.$^7$ .................................................. H01L 21/302
(52) U.S. Cl. ...................... 438/745; 438/747; 438/749; 438/753; 438/756
(58) Field of Search .................................. 438/745, 747, 438/689, 756, 753, 749; 216/109; 257/347

(56) References Cited

U.S. PATENT DOCUMENTS

| | | | |
|---|---|---|---|
| 5,176,756 | * | 1/1993 | Nakashima et al. ..................... 134/2 |
| 5,439,569 | * | 8/1995 | Carpio .................................. 204/153.1 |
| 5,472,516 | * | 12/1995 | Hanson et al. ......................... 134/18 |
| 5,543,648 | * | 8/1996 | Miyawaki ............................. 257/347 |
| 5,578,273 | * | 11/1996 | Hanson et al. ......................... 422/110 |

FOREIGN PATENT DOCUMENTS

| | | |
|---|---|---|
| 4-278529 | 10/1992 | (JP) . |
| 5-259141 | 10/1993 | (JP) . |
| 7-142435 | 6/1995 | (JP) . |
| 8-017775 | 1/1996 | (JP) . |
| 8-097181 | 4/1996 | (JP) . |
| 10-183185 | 7/1998 | (JP) . |

* cited by examiner

*Primary Examiner*—Robert Kunemund
*Assistant Examiner*—Binh X Tran
(74) *Attorney, Agent, or Firm*—Sughrue, Mion, Zinn, Macpeak & Seas, PLLC

(57) ABSTRACT

In a wet-chemical treatment of a semiconductor substrate with a chemical treatment fluid containing ammonia and hydrogen peroxide, an experiment is carried out in a system where the concentrations of chemical species are known, to experimentally previously determine a relation between an etching rate of an $SiO_2$ film with a mixture of ammonia and hydrogen peroxide and the concentrations of the dissolved chemical species (calculated by a chemical equilibrium analysis) or the temperature of the chemical treatment fluid, and the determined relation is then expressed. The concentrations of the chemical species are calculated by the chemical equilibrium analysis on the basis of values measured by a chemical treatment fluid composition monitor at a suitable interval and values measured by a fluid temperature sensor, and in accordance with the expressed relation, the etching rate of the $SiO_2$ film with the chemical treatment fluid is calculated at the suitable interval. This result is fed back to a replenish mechanism of a wet-chemical treatment apparatus to regulate the amounts of the chemicals, thereby controlling the concentrations of the chemical treatment fluid. In consequence, there can be provided a wet-chemical treatment method which can stably treat the semiconductor.

7 Claims, 6 Drawing Sheets

WET-CHEMICAL TREATMENT METHOD, TREATMENT METHOD OF SEMICONDUCTOR SUBSTRATE, AND MANUFACTURING METHOD OF SEMICONDUCTOR DEVICE

BACKGROUND OF THE INVENTION

1. Field of the Invention

The present invention relates to a wet chemical treatment method in which the treating (the etching or the wet cleaning) of a semiconductor substrate is carried out in a manufacturing process of semiconductor devices or the like.

2. Description of the Prior Art

In the case of a typical wet cleaning method of a semiconductor substrate in which a cleaning fluid containing aqueous ammonia and aqueous hydrogen peroxide is used, the cleaning fluid is heated up to about 60° C. and the semiconductor substrate is cleaned, and the concentrations of chemical components in a treatment bath change with time toward their decrease owing to the evaporation, the decomposition and the like of the chemicals.

A conventional wet cleaning machine, as shown in FIG. 5, is provided with a storage tank 105 for storing aqueous ammonia, a storage tank 106 for storing aqueous hydrogen peroxide and a storage tank 107 for storing pure water, and required amounts of aqueous ammonia, aqueous hydrogen peroxide and pure water are fed from these storage tanks 105, 106 and 107 to a treatment bath 101 by the driving of solution feed pumps 108, 109 and 110. Next, in the treatment bath 101, a semiconductor substrate (not shown) is cleaned. Reference numeral 102 is a circulating pump of the treatment bath, and numeral 103 is its filter. In this case, aqueous ammonia and aqueous hydrogen peroxide are automatically replenished to the treatment bath 101 every predetermined amount at a certain time interval.

In this method, however, it is difficult to constantly keep the concentrations of the respective chemical components in the treatment bath 101, and in the case that the method of an automatic replenishment is not optimized, the concentrations of the respective drug solutions noticeably change with time, so that the scattering of the concentrations increases inconveniently.

In order to constantly keep the concentration of the cleaning fluid in the treatment bath, as shown in FIG. 6 of Japanese Patent Application Laid-open No. 278529/1992, a wet cleaning machine is used in which an ammonia component analyzer 161 for measuring the concentration of ammonia and a hydrogen peroxide component analyzer 162 for measuring the concentration of hydrogen peroxide are attached to a treatment bath 151, and the concentrations of ammonia and hydrogen peroxide in the cleaning fluid are separately monitored via a filter 154, a solution feed pump 153 and open-close valves 163, 164. On the basis of signals from the component analyzers 161, 162, open-close valves 155a, 156a disposed in the storage tank 155 for storing ammonia and the storage tank 156 for storing hydrogen peroxide are controlled to automatically replenish the chemical treatment fluid whose concentrations decrease, whereby the concentration of the cleaning fluid can be constantly kept up.

Furthermore, the concentration decrease of hydrogen peroxide is usually slighter, as compared with the concentration decrease of ammonia by evaporation and the like, and therefore, Japanese Patent Application Laid-open No. 259141/1993 has disclosed a method in which aqueous hydrogen peroxide is not replenished and aqueous ammonia alone is replenished in accordance with a treatment temperature.

In all of the above-mentioned conventional techniques, much attention is paid to the control of the composition. Needless to say, if the composition is constantly kept, a wet-chemical treatment ability can be constantly maintained, but in Japanese Patent Application Laid-open No. 142435/1995, it has been disclosed that as long as the wet cleaning is carried out in a concentration region in which an etching rate to an ammonia concentration scarcely fluctuates, the wet-chemical treatment ability can be maintained, even if the composition is not always strictly constantly kept.

Japanese Patent Application Laid-open No. 142435/1995 has disclosed a method in which the wet cleaning is carried out in the concentration region in which the etching rate to the ammonia concentration scarcely fluctuates, and another method comprising a combination of this method and a method in which a concentration control is carried out by measuring the concentrations of the chemical components or a method in which ammonia alone is replenished.

In a method disclosed in Japanese Patent Application Laid-open No. 278529/1992 in which the treatment is carried out, keeping the composition of the chemical treatment fluid constantly, the chemical containing the chemical component of which concentration largely fluctuates by volatilization and decomposition is replenished in order to keep the concentration of the chemical component, and at this time, the other chemical components are diluted with this replenishment. In consequence, the other chemicals containing the other chemical components must also be replenished. Therefore, the large amounts of the chemicals which are to be fed to the treatment bath are required. That is to say, in order to constantly keep the concentrations of the respective chemical components, the replenishment of the large amounts of the chemicals is necessary in addition to the strict concentration control.

The methods of Japanese Patent Application Laid-open No. 259141/1993 and Japanese Patent Application Laid-open No. 142435/1995 are measures devised to deal with the problem of the method of Japanese Patent Application Laid-open No. 278529/1992, but these methods are applicable techniques only under predetermined cleaning conditions. In the disclosed methods, it is difficult to accomplish the cleaning under the above-mentioned conditions sometimes, depending on an object to be cleaned.

In the case of the chemical treatment fluid containing ammonia and hydrogen peroxide, chemical species such as $NH_3$, $NH_4^+$, $H_2O_2$, $HO_2^-$, $H^+$, $OH^-$ and $H_2O$ are present. Moreover, in the chemical treatment fluid which is cleaning an silicon substrate, there is a pollutant on the surface of the substrate, and chemical species produced by the reaction of the pollutant and the chemical species of the fluid. The cleaning performance of the chemical treatment fluid during the cleaning process depends on the concentrations of the various chemical species, reaction rates and free energies of the chemical reaction in which the above-mentioned chemical components relate, a treatment temperature and the homogeneity of the concentrations of the chemical species in the treatment bath.

However, conventional techniques such as the above-mentioned disclosed techniques are limited to the control of the concentrations of the chemical components, and decision factors of cleaning ability, particularly the concentrations of the dissolved chemical species and the reactions of the chemical species have not been sufficiently controlled. With the high integration of semiconductor devices, it is becoming necessary to strictly control the cleaning ability of the chemical treatment fluid in order to obtain a high reliability and yield of the semiconductor devices. In addition, from the viewpoint of the increase in consciousness of environmental problems on a global scale at present, the reduction of an environmental load by manufacturing, i.e., the amounts of chemicals to be used is desired.

SUMMARY OF THE INVENTION

In view of the above-mentioned problems, the present invention has been developed, and an object of the present invention is to provide a wet-chemical treatment method which can control the activity of a chemical treatment fluid which is a mixture of chemicals and can reduce the amounts of the chemicals to be replenished.

The present invention is directed to a method of controlling the composition of a chemical treatment fluid to be used for wet-chemical treatment of a semiconductor substrate which comprises immersing the semiconductor substrate in a chemical treatment fluid containing ammonia and hydrogen peroxide, said method comprising the steps of analyzing chemical reactions regarding the wet-chemical treatment by a chemical equilibrium analysis, a chemical reaction rate analysis and another chemical reaction analysis means, collating the analytical results with the experimentally obtained results of wet-chemical treatment performances to obtain expressions in which the wet-chemical treatment performances are represented by the concentrations of chemical species in the chemical treatment fluid, a temperature and the properties of an object to be treated, and utilizing the expressions for the control of the wet-chemical treatment.

BRIEF DESCRIPTION OF THE DRAWINGS

Further objects and advantages of the present invention can be more fully understood from the following detailed description taken in conjunction with the accompanying drawings in which.

DESCRIPTION OF THE PREFERRED EMBODIMENTS

Figure 1:
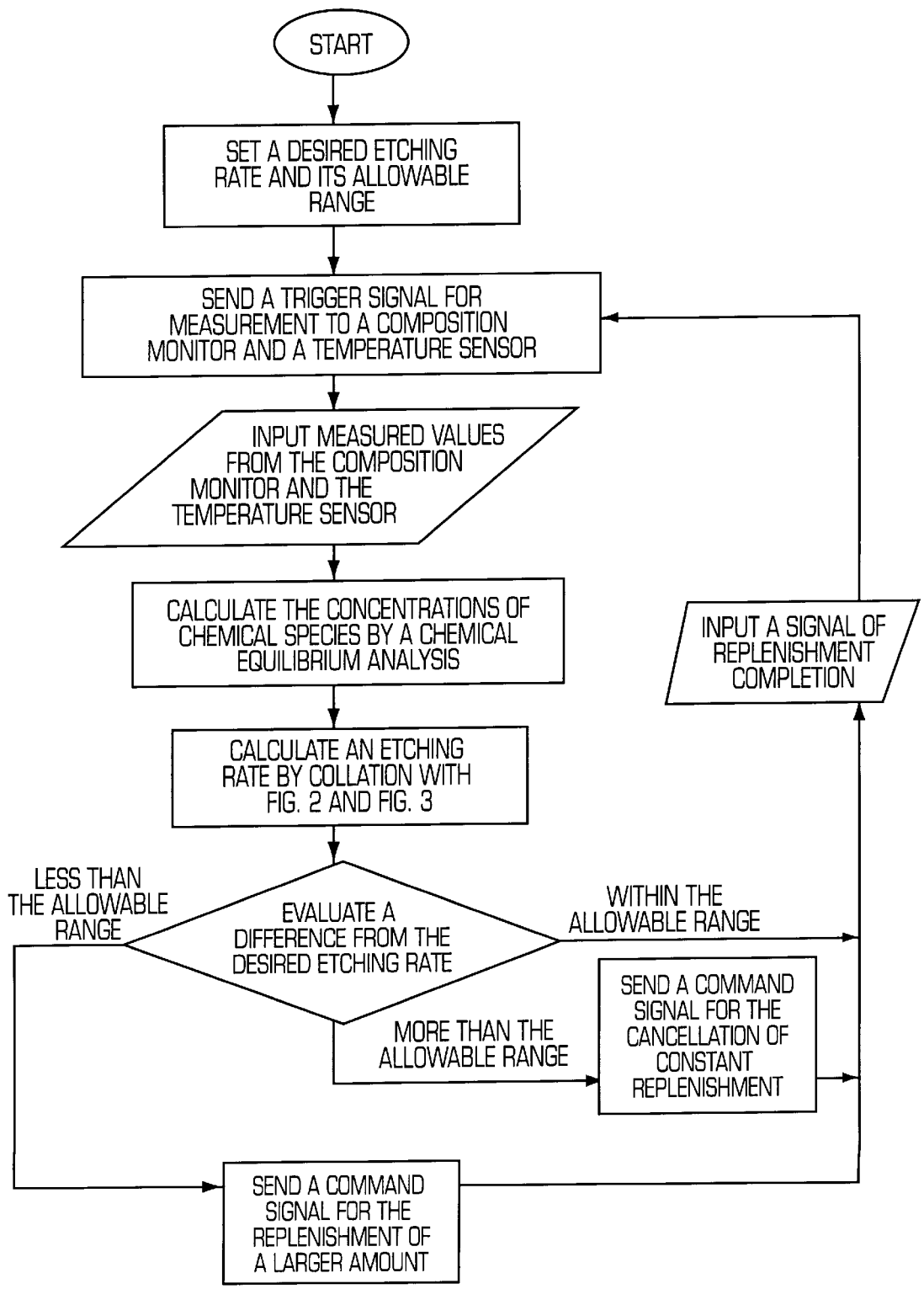
FIG. 1 is a flow chart of a control in a cleaning machine to which a wet-chemical treatment method to be used for treating a semiconductor substrate according to the present invention is applied.

In a wet cleaning treatment in which a semiconductor substrate is immersed in a chemical treatment fluid containing ammonia and hydrogen peroxide, the cleaning ability of the chemical treatment fluid can be represented by the etching rate of an $SiO_2$ film (hereinafter referred to as "dR/dt"), and dR/dt can be expressed by a function which depends on an $OH^-$ concentration in the chemical treatment fluid and a treatment temperature.

The etching rate dR/dt depends on the composition of the chemical treatment fluid, but the composition which can give the desired dR/dt is not limited to one specific composition. The concentrations of various chemical species can be calculated from the measured results of the chemical treatment fluid composition (a commercially available chemical treatment fluid composition monitor can be utilized) by a chemical equilibrium analysis, or can be approximately calculated from the results measured by a measurement technique such as an optical measurement or an electrochemical measurement.

The present invention has been attained on the basis of the above-mentioned discovery by the present inventors, and the present invention is concerned with a wet-chemical treatment method to be used for processing a semiconductor substrate which comprises immersing the semiconductor substrate in a chemical treatment fluid containing ammonia and hydrogen peroxide to treat the surface of the substrate, said method comprising the steps of analyzing chemical reactions regarding the wet-chemical treatment by a chemical equilibrium analysis, a chemical reaction rate analysis and another chemical reaction analysis means, collating the analytical results with the experimentally obtained results of wet-chemical treatment performances to obtain expressions in which the wet-chemical treatment performances are represented by the concentrations of chemical species in the chemical treatment fluid, a temperature and the properties of the object to be treated, and utilizing the expressions for the control of the wet-chemical treatment. In a typical wet-chemical treatment, an object to be treated is a semiconductor substrate on whose surface an $SiO_2$ film is formed, or silicon substrate on whose surface the $SiO_2$ film can be formed by its immersion in the chemical treatment fluid, and the wet-chemical treatment is an etching process of the substrate surfaces or a wet-chemical process in which the etching function is utilized.

Typically, in the control of the wet-chemical treatment, it is characterized that a hydroxide ion ($OH^-$) concentration calculated by the chemical equilibrium analysis is employed as an indication of the wet-chemical treatment ability, and the expression including the $OH^-$ concentration and the temperature is utilized for the control of the wet-chemical treatment ability.

In the wet-chemical treatment method of the present invention, the chemical treatment fluid composition in the wet-chemical treatment apparatus is measured, and as occasion demands, the kinds of chemical species dissolved in the chemical treatment fluid and the concentrations of these chemical species are calculated from the measured results by the chemical equilibrium analysis. Furthermore, the wet-chemical treatment ability is calculated, and the thus calculated value is then used for the control of the wet-chemical treatment. Therefore, the reproducibility of the wet-chemical treatment can be heightened, and the yield and the reliability of the semiconductor devices can be improved. In addition, since the chemicals can be efficiently replenished, their amounts to be replenished can be reduced.

The method of the present invention covers the following embodiments.

(1) A method of controlling the composition of a chemical treatment fluid to be used for processing a semiconductor substrate which comprises immersing the semiconductor substrate in a chemical treatment fluid containing ammonia and hydrogen peroxide to treat the surface of the substrate, said method comprising the steps of analyzing a chemical reaction regarding the wet-chemical treatment by a chemical equilibrium analysis, a chemical reaction rate analysis and another chemical reaction analysis means, collating the analytical results with the experimentally obtained results of a wet-chemical treatment performance to obtain expressions in which the wet-chemical treatment performance is represented by the concentrations of chemical species in the chemical treatment fluid, a treatment temperature and the properties of the object to be treated, and utilizing these expressions for the control of the composition of the chemical treatment fluid.

(2) The method of controlling the composition of a chemical treatment fluid to be used for processing a semiconductor substrate according to the above-mentioned paragraph (1) wherein an object to be treated is a semiconductor substrate on whose surface an $SiO_2$ film is formed, or an silicon substrate on whose surface the $SiO_2$ film can be formed by its immersion in the chemical treatment fluid, and the wet-chemical treatment is an etching process of the substrate surface or a wet cleaning process utilizing an etching function.

(3) The method of controlling the composition of a chemical treatment fluid to be used for processing a semiconductor substrate according to the above-mentioned paragraph (1) or (2) wherein a hydroxide ion ($OH^-$) concentration calculated by the chemical equilibrium analysis is employed as the indication of a wet-chemical treatment ability, and the expression including the $OH^-$ concentration and the temperature is utilized for the control of the wet-chemical treatment ability.

(4) A manufacturing method of a semiconductor device which comprises a process step of a semiconductor substrate by the use of a chemical treatment fluid with which a controlling is made in accordance with a method described in any one of the above-mentioned paragraphs (1) to (3).

Next, a practical embodiment of the present invention will be described with reference to drawings.

FIG. 1 is a flow chart of a control treatment in a wet cleaning machine in which the composition of a chemical treatment fluid controlling method to be used for processing a semiconductor substrate according to the present invention is applied.

A desired etching rate and its allowable range are set as initial-values. After the start of cleaning, a trigger signal is sent to a composition monitor and a temperature sensor every certain time in order to indicate measurement. In response of the trigger signal, a measured value is input. On the basis of the measured value, a concentration of a chemical species is calculated. The detail of the calculation is as follows.

A chemical equilibrium in a chemical treatment fluid containing ammonia and hydrogen peroxide can be represented by formulae 1 to 6. The formula 1 shows a dissociation equilibrium of ammonia; the equation 2 shows a dissociation equilibrium of hydrogen peroxide; and the equation 3 shows dissociation equilibrium of water. $Ka(NH_4^+)$, $Ka(H_2O_2)$ and $Kw$ are constants (equilibrium constants) which depend on the temperature, and they are represented by the formula 7.

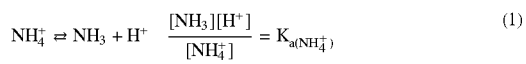

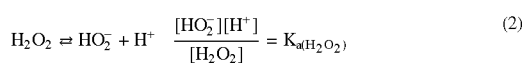

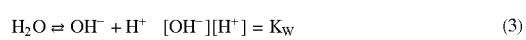

In the formula 7, $\Delta H°$ is a standard enthalpy of each reaction; $\Delta S°$ is a standard entropy of each reaction; and T is an absolute temperature. $\Delta H°$ and $\Delta S°$ of each chemical reaction are known, and therefore, if the temperature T is decided, the respective equilibrium constants in the formulae 1 to 3 can be calculated.

The total concentrations A and B of ammonia and hydrogen peroxide

A: $C_{T(NH_3)}$

B: $C_{T(H_2O_2)}$ can each be represented by the sum of an non-dissociated species and a dissociated species, as shown by the above-mentioned formulae 4 and 5. The formula 6 denotes that the total of cations is equal to that of anions in the solution.

If the chemical treatment fluid composition, i.e., the above-mentioned A (the formula 4) and B (the formula 5) are decided, the concentrations of chemical species $NH_3$, $NH_4^+$, $H_2O_2$, $HO_2^-$, $H^+$ and $OH^-$ in the chemical treatment fluid containing ammonia and hydrogen peroxide can be calculated (the chemical equilibrium analysis).

Figure 2:
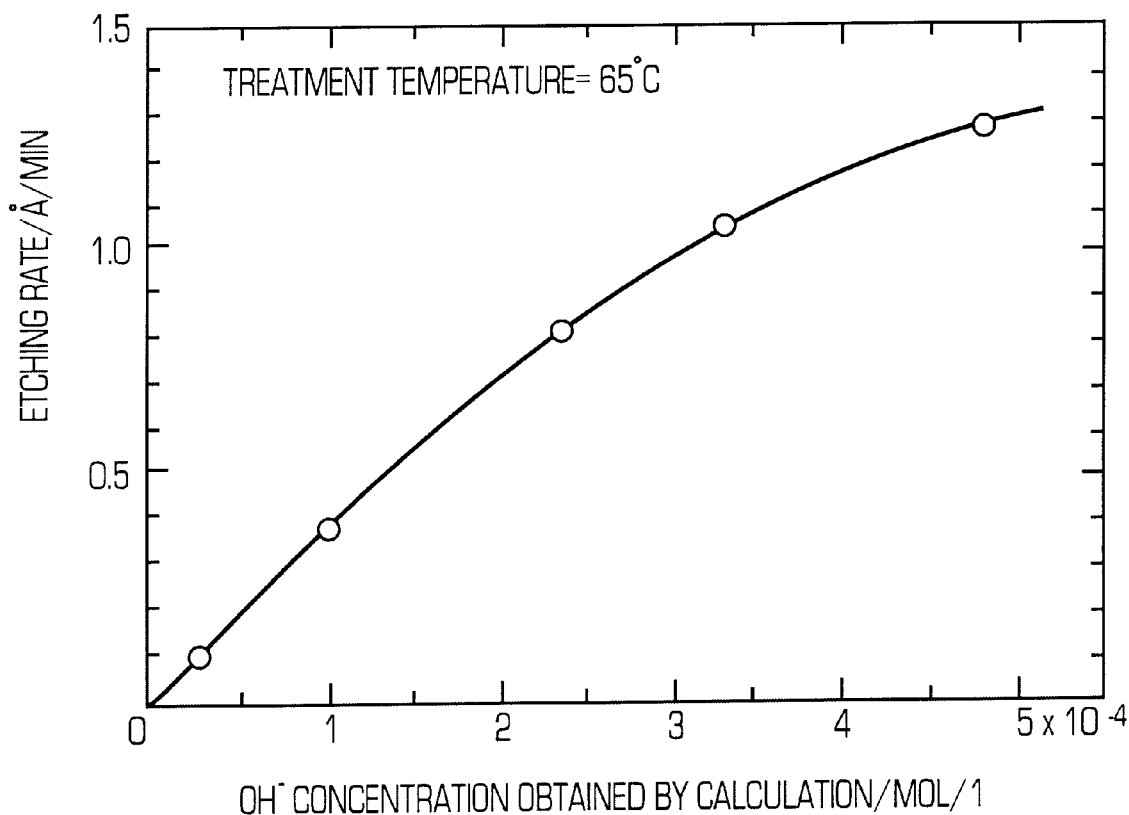
FIG. 2 shows a relation between an $OH^-$ concentration in a chemical treatment fluid containing ammonia and hydrogen peroxide and an etching rate of an silicon substrate by this chemical treatment fluid.
Figure 3:
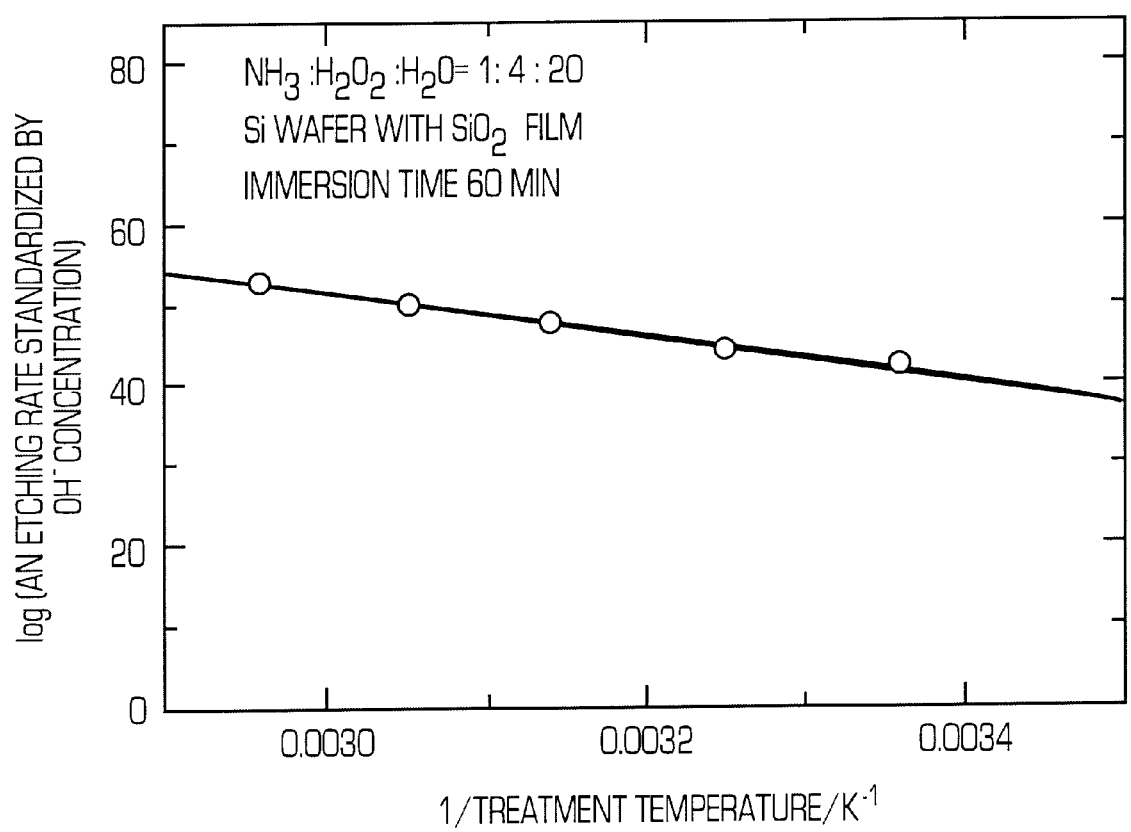
FIG. 3 shows a relation between a temperature of the chemical treatment fluid containing ammonia and hydrogen peroxide and an etching rate by this chemical treatment fluid.

According to experiments previously carried out, it is apparent that, at a treatment temperature of 65° C., between an etching rate and an OH- concentration calculated by the chemical equilibrium analysis, a relation shown in FIG. 2 is established, and between a temperature and the etching rate, a relation shown in FIG. 3 is established.

The etching rate is calculated by collating the $OH^-$ concentration calculated by the chemical equilibrium analysis and the treatment temperature measured by a temperature sensor with the relations of FIGS. 2 and 3. Such relations as in FIGS. 2 and 3 can suitably previously be calculated in addition to the foregoing to get ready for the calculation of the etching rate as needed.

A difference between the desired etching rate and the practical etching rate is evaluated, and if the difference is within the above-mentioned allowable range, a usual replenishment operation is carried out. If it is more than the allowable range, a command signal for indicating the cancellation of the direct replenishment is sent, and on the other hand, if it is less than the allowable range, a command signal for indicating the replenishment of a larger amount than in a usual case is sent. When a confirmation signal of replenishment completion is received, the trigger signal for indicating the measurement is sent to the composition monitor and the temperature sensor again.

Figure 4:
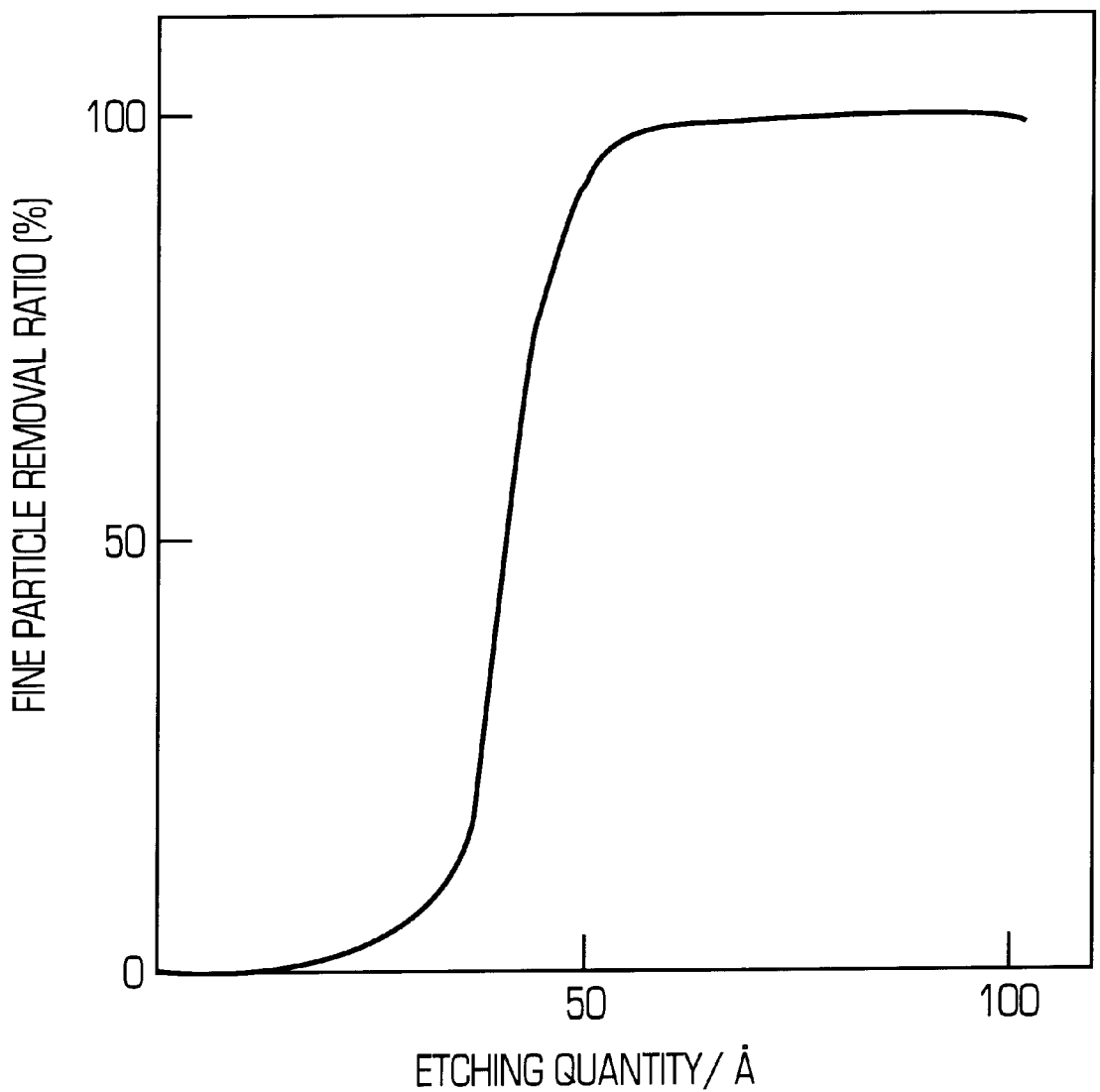
FIG. 4 shows a relation between an etching quantity of the silicon substrate by the chemical treatment fluid containing ammonia and hydrogen peroxide and a fine particle removal ratio.
Figure 5:
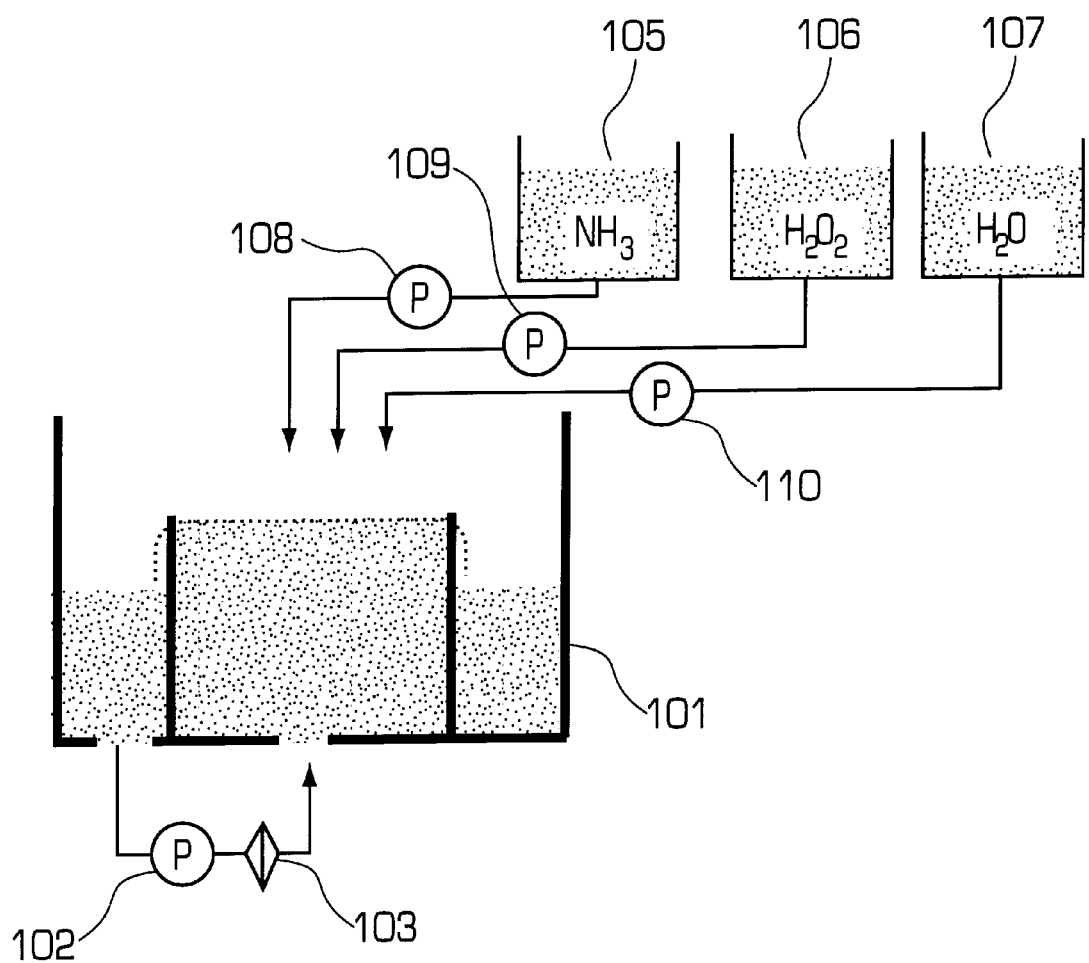
FIG. 5 is a constitutional view of a treatment apparatus which is used in one conventional example of the wet-chemical treatment to be used for treating the semiconductor substrate.
Figure 6:
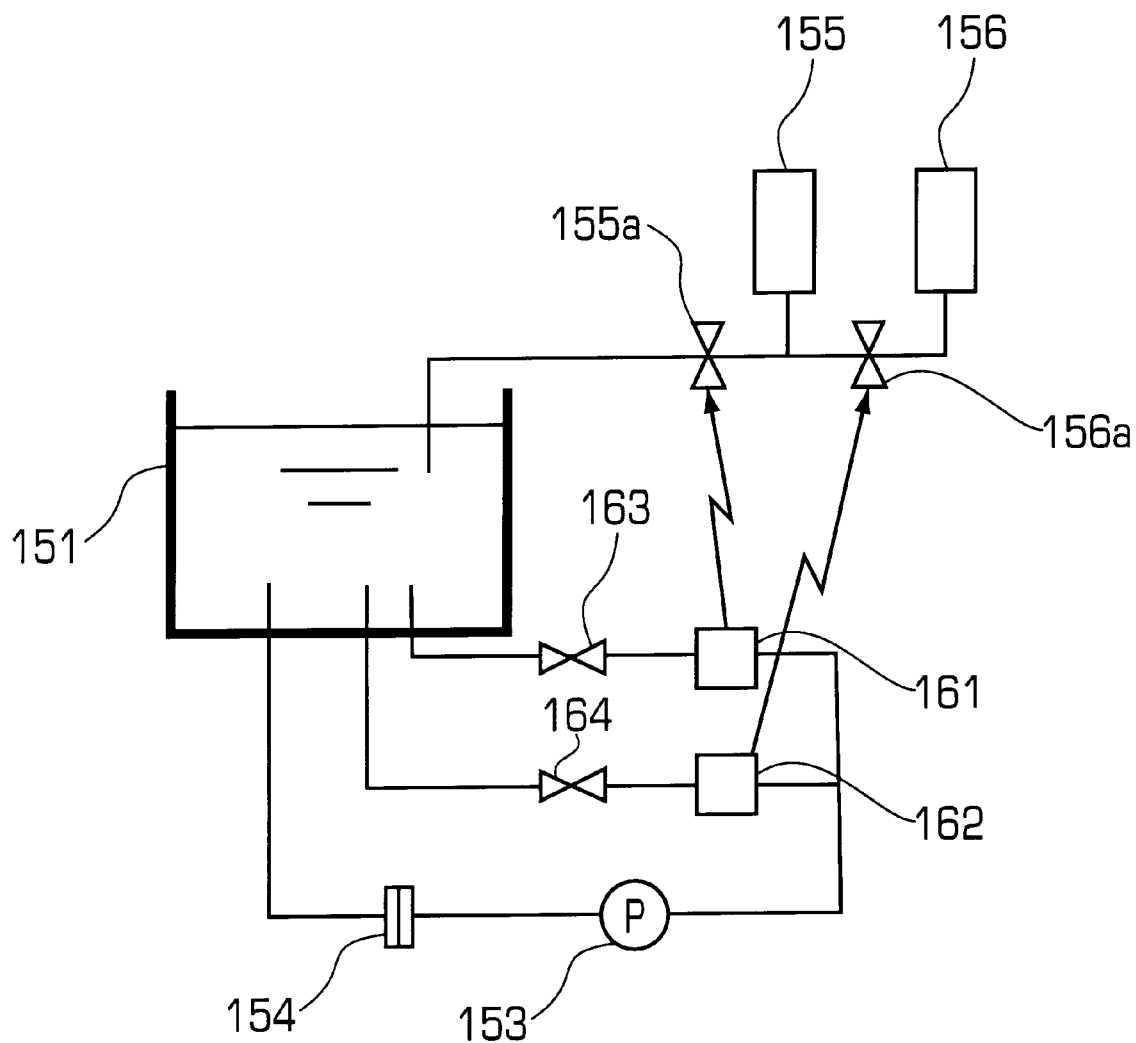
FIG. 6 is a constitutional view of a treatment apparatus which is used in another conventional example of the wet-chemical treatment to be used for treating the semiconductor substrate.

In the wet cleaning for removing fine particles by the chemical treatment fluid, a relation shown in FIG. 4 is present between a surface etching quantity and a particle removal ratio, and if the etching quantity is strictly controlled in the above-mentioned manner, the surface of the Si semiconductor substrate can be cleaned without excessively etching the surface of the substrate or the $SiO_2$ film and without incompletely removing the fine particles.

As described above, according to the present invention, a wet-chemical treatment ability is stable, and a yield and a reliability of the semiconductor devices can be improved. In addition, the amount of the chemicals to be replenished can also be inhibited.

What is claimed is:

1. A method of controlling the composition of a chemical treatment fluid to be used for the wet-chemical treatment of a semiconductor substrate by immersing the semiconductor substrate in a chemical treatment fluid containing ammonia and hydrogen peroxide to treat the surface of the substrate, said method comprising the steps of
   (a) measuring the composition and temperature of the chemical treatment fluid,
   (b) calculating the concentration of chemical species in the chemical treatment fluid using a chemical equilibrium analysis based on the measured values obtained in step (a),
   (c) calculating target wet-chemical treatment performance values by determining relationships between the chemical species concentration in the chemical treatment fluid, the treatment temperature and wet-chemical treatment performance,
   (d) repeating steps (a) and (b) and calculating an actual wet-chemical treatment performance value using the calculated chemical species concentration value and the measured temperature value,
   (e) measuring a difference between the calculated wet-chemical treatment performance value obtained in step (d) and the target wet-chemical treatment performance value in step (c), and
   (f) controlling a replenishment of the chemical treatment fluid based on the measured value obtained in step (e).

2. A method of manufacturing a semiconductor device which comprises a step of processing a semiconductor substrate with a chemical treatment fluid, wherein the composition of the chemical treatment fluid is controlled as set forth in claim 1.

3. A method of controlling the composition of a chemical treatment fluid to be used for processing a semiconductor substrate according to claim 1, wherein a hydroxide ion ($OH^-$) concentration calculated by the chemical equilibrium analysis and the treatment temperature are employed to calculate wet-chemical treatment performance in steps (c) and (d).

4. A method of manufacturing a semiconductor device which comprises a step of processing a semiconductor substrate with a chemical treatment fluid, wherein the composition of the chemical treatment fluid is controlled as set forth in claim 3.

5. A method of controlling the composition of a chemical treatment fluid to be used for processing a semiconductor substrate according to claim 1, wherein said semiconductor substrate is a semiconductor substrate on whose surface an $SiO_2$ film is formed, or a silicon substrate on whose surface an $SiO_2$ film can be formed by immersion of the silicon substrate in the chemical treatment fluid, and the wet-chemical treatment is an etching process of the substrate surface or a wet cleaning process utilizing an etching function.

6. A method of controlling the composition of a chemical treatment fluid to be used for processing a semiconductor substrate according to claim 5, wherein a hydroxide ion ($OH^-$) concentration calculated by the chemical equilibrium analysis and the treatment temperature are employed to calculate wet-chemical treatment performance in steps (c) and (d).

7. A method of manufacturing a semiconductor device which comprises a step of processing a semiconductor substrate with a chemical treatment fluid, wherein the composition of the chemical treatment fluid is controlled as set forth in claim 5.

* * * * *

UNITED STATES PATENT AND TRADEMARK OFFICE
CERTIFICATE OF CORRECTION

PATENT NO. : 6,171,975
DATED : January 9, 2001
INVENTOR(S) : Ushio Hase, Kenichi Yamamoto, Ichiro Miyzawa Page 1 of 1

It is certified that error appears in the above-identified patent and that said Letters Patent is hereby corrected as shown below:

Column 6,
Line 11, delete "$C_{T(NK2)}$" insert -- $C_{T(NH3)}$ --

Signed and Sealed this

Twenty-third Day of October, 2001

Attest:

NICHOLAS P. GODICI
Attesting Officer  Acting Director of the United States Patent and Trademark Office